United States Patent
Hemenway et al.

(10) Patent No.: US 10,153,608 B2
(45) Date of Patent: Dec. 11, 2018

(54) SPECTRALLY MULTIPLEXING DIODE PUMP MODULES TO IMPROVE BRIGHTNESS

(71) Applicant: nLIGHT, Inc., Vancouver, WA (US)

(72) Inventors: David Martin Hemenway, Beaverton, OR (US); David C. Dawson, Brush Prairie, WA (US); Wolfram Urbanek, Camas, WA (US); Roger L. Farrow, Vancouver, WA (US); Dahv A. V. Kliner, Portland, OR (US)

(73) Assignee: NLIGHT, INC., Vancouver, WA (US)

( * ) Notice: Subject to any disclaimer, the term of this patent is extended or adjusted under 35 U.S.C. 154(b) by 0 days.

(21) Appl. No.: 15/462,596

(22) Filed: Mar. 17, 2017

(65) Prior Publication Data
US 2017/0271837 A1   Sep. 21, 2017

Related U.S. Application Data

(60) Provisional application No. 62/310,511, filed on Mar. 18, 2016.

(51) Int. Cl.
*H01S 5/026* (2006.01)
*H01S 3/094* (2006.01)
(Continued)

(52) U.S. Cl.
CPC .... *H01S 3/094096* (2013.01); *G02B 6/03638* (2013.01); *G02B 27/141* (2013.01);
(Continued)

(58) Field of Classification Search
CPC ........ H01S 3/067; H01S 3/23; H01S 3/08059; H01S 3/2383; H01S 3/086; H01S 3/0941; B23K 26/867
(Continued)

(56) References Cited

U.S. PATENT DOCUMENTS

| 3,622,906 A | 11/1971 | Nyul |
| 3,827,059 A | 7/1974 | Rambauske |

(Continued)

FOREIGN PATENT DOCUMENTS

| CN | 1829015 | 9/2006 |
| CN | 1975507 | 6/2007 |

(Continued)

OTHER PUBLICATIONS

International Search Report and Written Opinion for related International Application No. PCT/US2017/023067, 12 pages, dated Jun. 27, 2017.

(Continued)

*Primary Examiner* — Tuan Nguyen

(57) ABSTRACT

A method of spectrally multiplexing diode pump modules to increase brightness includes generating one or more pump beams from respective diode lasers at a first wavelength in a diode laser package, generating one or more pump beams from respective diode lasers at a second wavelength different from the first wavelength in the diode laser package, wavelength combining at least one of the pump beams at the first wavelength with at least one of the pump beams at the second wavelength to form one or more combined pump beams, and receiving the combined pump beams in a pump fiber coupled to the diode laser package. Laser systems can include multi-wavelength pump modules and a gain fiber having a core actively doped so as to have an absorption spectrum corresponding to the multiple wavelength, the gain fiber situated to receive the pump light and to produce an output beam at an output wavelength.

29 Claims, 10 Drawing Sheets

(51) Int. Cl.
  *G02B 6/036* (2006.01)
  *G02B 27/14* (2006.01)
  *H01S 3/067* (2006.01)
  *H01S 3/0941* (2006.01)
  *H01S 3/16* (2006.01)
  *H01S 3/23* (2006.01)
  *H01S 5/022* (2006.01)
  *H01S 5/024* (2006.01)
  *H01S 5/14* (2006.01)
  *H01S 5/40* (2006.01)
  *H01S 3/10* (2006.01)
  *H01S 3/102* (2006.01)

(52) U.S. Cl.
  CPC ........... *G02B 27/146* (2013.01); *H01S 3/067* (2013.01); *H01S 3/06754* (2013.01); *H01S 3/0941* (2013.01); *H01S 3/09415* (2013.01); *H01S 3/094003* (2013.01); *H01S 3/094007* (2013.01); *H01S 3/094053* (2013.01); *H01S 3/10007* (2013.01); *H01S 3/1022* (2013.01); *H01S 3/10023* (2013.01); *H01S 3/10038* (2013.01); *H01S 3/1618* (2013.01); *H01S 3/2308* (2013.01); *H01S 5/02284* (2013.01); *H01S 5/02288* (2013.01); *H01S 5/02469* (2013.01); *H01S 5/141* (2013.01); *H01S 5/4012* (2013.01); *H01S 5/4087* (2013.01); *H01S 2301/04* (2013.01)

(58) Field of Classification Search
  USPC .......................... 372/6, 50.12, 107; 359/618
  See application file for complete search history.

(56) References Cited

U.S. PATENT DOCUMENTS

| | | |
|---|---|---|
| 4,151,582 A | 4/1979 | Grunberger |
| 4,550,333 A | 10/1985 | Ridder et al. |
| 4,609,262 A | 9/1986 | Fujikawa et al. |
| 4,689,482 A | 8/1987 | Horikawa et al. |
| 4,716,568 A | 12/1987 | Scifres et al. |
| 4,719,631 A | 1/1988 | Conaway |
| 4,828,357 A | 5/1989 | Arata et al. |
| 5,048,911 A | 9/1991 | Sang et al. |
| 5,077,750 A | 12/1991 | Pocholle et al. |
| 5,105,430 A | 4/1992 | Mundinger et al. |
| 5,168,401 A | 12/1992 | Endriz |
| 5,251,060 A | 10/1993 | Uenishi et al. |
| 5,305,344 A | 4/1994 | Patel |
| 5,319,528 A | 6/1994 | Raven |
| 5,515,391 A | 5/1996 | Endriz |
| 5,610,930 A | 3/1997 | Macomber et al. |
| 5,668,822 A | 9/1997 | Tada |
| 5,764,675 A | 6/1998 | Juhala |
| 5,825,551 A | 10/1998 | Clarkson et al. |
| 5,828,683 A | 10/1998 | Freitas |
| 5,887,096 A | 3/1999 | Du et al. |
| 5,898,211 A | 4/1999 | Marshall et al. |
| 5,909,458 A | 6/1999 | Freitas et al. |
| 5,986,794 A | 11/1999 | Krause et al. |
| 5,987,043 A | 11/1999 | Brown et al. |
| 6,028,722 A | 2/2000 | Lang |
| 6,041,072 A * | 3/2000 | Ventrudo ............ G02B 6/02076 372/102 |
| 6,044,096 A | 3/2000 | Wolak et al. |
| 6,057,871 A | 5/2000 | Peterson |
| 6,075,912 A | 6/2000 | Goodman |
| 6,115,185 A | 9/2000 | Du et al. |
| 6,124,973 A | 9/2000 | Du et al. |
| 6,212,310 B1 * | 4/2001 | Waarts ............... G02B 6/29319 372/43.01 |
| 6,229,831 B1 | 5/2001 | Nightingale et al. |
| 6,240,116 B1 | 5/2001 | Lang et al. |
| 6,266,359 B1 | 7/2001 | Taheri et al. |
| 6,324,320 B1 | 11/2001 | Goodman |
| 6,327,285 B1 | 12/2001 | Wang |
| 6,377,410 B1 | 4/2002 | Wang et al. |
| 6,462,883 B1 | 10/2002 | Wang et al. |
| 6,552,853 B2 | 4/2003 | Goodman |
| 6,556,352 B2 | 4/2003 | Wang et al. |
| 6,636,538 B1 | 10/2003 | Stephens |
| 6,673,699 B2 | 1/2004 | Hubbard et al. |
| 6,680,800 B1 | 1/2004 | Schreiber et al. |
| 6,683,727 B1 | 1/2004 | Goring et al. |
| 6,700,709 B1 | 3/2004 | Fermann |
| 6,710,926 B2 | 3/2004 | Beach et al. |
| 6,765,725 B1 | 7/2004 | Fermann et al. |
| 6,778,732 B1 | 8/2004 | Fermann |
| 6,898,222 B2 | 5/2005 | Hennig et al. |
| 6,903,863 B1 * | 6/2005 | Carniel ............... H01S 3/06754 359/334 |
| 6,975,659 B2 | 12/2005 | Nagano et al. |
| 7,420,996 B2 | 9/2008 | Schulte et al. |
| 7,436,868 B2 | 10/2008 | Schulte et al. |
| 7,443,895 B2 | 10/2008 | Schulte et al. |
| 7,537,395 B2 * | 5/2009 | Savage-Leuchs .... G02B 6/4296 372/6 |
| 7,586,963 B2 | 9/2009 | Schulte et al. |
| 7,733,932 B2 | 6/2010 | Faybishenko |
| 7,751,458 B2 | 7/2010 | Regaard et al. |
| 7,764,723 B2 | 7/2010 | Ovtchinnikov et al. |
| 7,830,608 B2 | 11/2010 | Hu |
| 7,848,372 B2 | 12/2010 | Schulte et al. |
| 7,947,517 B2 | 5/2011 | Hisa |
| 8,000,360 B2 | 8/2011 | Faybishenko |
| 8,066,389 B2 | 11/2011 | Silverstein et al. |
| 8,126,028 B2 | 2/2012 | Clifford, Jr. |
| 8,339,598 B2 | 12/2012 | Ban et al. |
| 8,427,749 B2 | 4/2013 | Du et al. |
| 8,432,945 B2 | 4/2013 | Faybishenko |
| 8,437,086 B2 | 5/2013 | Du et al. |
| 8,488,245 B1 | 7/2013 | Chann |
| 8,508,729 B2 | 8/2013 | Ban et al. |
| 8,553,221 B2 | 10/2013 | Volodin et al. |
| 8,599,485 B1 | 12/2013 | Cobb |
| 8,654,326 B2 | 2/2014 | Volodin et al. |
| 8,830,587 B2 | 9/2014 | Bhatia et al. |
| 8,842,369 B2 | 9/2014 | Li |
| 8,861,082 B2 | 10/2014 | Cobb |
| 8,873,134 B2 | 10/2014 | Price et al. |
| 8,891,579 B1 | 11/2014 | Price et al. |
| 8,942,521 B2 | 1/2015 | Song et al. |
| 9,005,262 B2 | 4/2015 | Liu et al. |
| 9,373,932 B2 | 6/2016 | Hayamizu et al. |
| 9,413,136 B1 | 8/2016 | Vethake et al. |
| 9,455,552 B1 | 9/2016 | Price et al. |
| 9,705,289 B2 | 7/2017 | Kanskar et al. |
| 9,720,145 B2 | 8/2017 | Kanskar |
| 2004/0114027 A1 | 6/2004 | Frith |
| 2004/0252388 A1 | 12/2004 | Yamanaka et al. |
| 2006/0165144 A1 | 7/2006 | Mikhailov et al. |
| 2006/0280209 A1 | 12/2006 | Treusch |
| 2007/0047401 A1 | 3/2007 | Sun |
| 2007/0116071 A1 | 5/2007 | Schulte et al. |
| 2007/0116077 A1 | 5/2007 | Farmer et al. |
| 2007/0217467 A1 | 9/2007 | DeFranza et al. |
| 2007/0217468 A1 | 9/2007 | DeFranza et al. |
| 2007/0217469 A1 | 9/2007 | DeFranza et al. |
| 2007/0217470 A1 | 9/2007 | DeFranza et al. |
| 2007/0217471 A1 | 9/2007 | DeFranza et al. |
| 2007/0236781 A1 * | 10/2007 | Fidric ............... H01S 3/09415 359/341.3 |
| 2007/0268572 A1 | 11/2007 | Hu |
| 2007/0268945 A1 | 11/2007 | Schulte et al. |
| 2007/0268946 A1 | 11/2007 | Schulte et al. |
| 2007/0268947 A1 | 11/2007 | Schulte et al. |
| 2008/0019010 A1 | 1/2008 | Govorkov et al. |
| 2010/0158060 A1 | 6/2010 | Faybishenko |
| 2010/0226405 A1 | 9/2010 | Chuyanov et al. |
| 2013/0148684 A1 | 6/2013 | Guo et al. |
| 2013/0162956 A1 | 6/2013 | Okuda |
| 2013/0194801 A1 | 8/2013 | Wolf et al. |

(56) References Cited

U.S. PATENT DOCUMENTS

| | | | |
|---|---|---|---|
| 2014/0036375 A1 | 2/2014 | Chann et al. | |
| 2014/0300971 A1 | 10/2014 | Wolak et al. | |
| 2015/0131692 A1 | 5/2015 | Hayamizu et al. | |
| 2015/0280404 A1 | 10/2015 | Kasai et al. | |
| 2015/0295386 A1 | 10/2015 | Hemenway et al. | |
| 2015/0349481 A1* | 12/2015 | Kliner .................. | H01S 3/0675 359/341.3 |
| 2016/0181764 A1 | 6/2016 | Kanskar et al. | |

FOREIGN PATENT DOCUMENTS

| | | |
|---|---|---|
| CN | 101141051 | 3/2008 |
| CN | 101144909 | 3/2008 |
| CN | 201113224 | 9/2008 |
| CN | 201515142 | 6/2010 |
| CN | 102074896 | 5/2011 |
| CN | 102437509 | 5/2012 |
| CN | 202548385 | 11/2012 |
| CN | 202720390 | 2/2013 |
| CN | 203071399 | 7/2013 |
| CN | 103368066 | 10/2013 |
| CN | 103401136 | 11/2013 |
| EP | 0721113 | 7/1996 |
| RU | 2010143026 | 4/2012 |
| WO | WO 2005059626 | 6/2005 |

OTHER PUBLICATIONS

Edwin, "Stripe Stacker for Use with Laser Diode Bars," Optics Letters, 20:222-224 (Jan. 15, 1995).

International Search Report and Written Opinion for International Application No. PCT/US2015/019288, dated Jun. 10, 2015.

International Search Report and Written Opinion from International Application No. PCT/US2017/018210, dated May 8, 2017, 12 pages.

Lens Cell, Crossed Cylinders, Pearl Drawing, 1 page (Feb. 22, 2007).

* cited by examiner

SPECTRALLY MULTIPLEXING DIODE PUMP MODULES TO IMPROVE BRIGHTNESS

CROSS REFERENCE TO RELATED APPLICATION

This application claims the benefit of U.S. Provisional Application No. 62/310,511, filed on Mar. 18, 2016, which is hereby incorporated by reference in its entirety.

FIELD

The disclosure pertains to diode-pumped fiber lasers.

BACKGROUND

Continuous-wave fiber lasers can generate multiple kilowatt laser beams with relatively superior beam quality. Power scaling of fiber lasers is limited by nonlinear processes in the fiber and by thermal effects. Methods are needed to address these limitations in order to enable further power scaling of fiber lasers in a practical manner. Additionally, various applications of laser diode sources, such as direct diode material processing, illumination, and pumping of solid state lasers, could benefit from brighter optical outputs.

SUMMARY

According to some examples of the disclosed technology, methods include generating one or more pump beams from respective diode lasers at a first wavelength, generating one or more pump beams from respective diode lasers at a second wavelength different from the first wavelength, combining at least one of the one or more pump beams at the first wavelength with at least one of the one or more pump beams at the second wavelength to form at least one combined pump beam, and directing at least one combined pump beam to a pump fiber. Some examples further include coupling at least one combined pump beam to a gain fiber so as to produce optical gain in the gain fiber, and the gain fiber includes a ytterbium-doped core, and the first wavelength corresponds to a ytterbium absorption peak or band associated with the wavelength range of 900 nm to 930 nm, and the second wavelength corresponds to a ytterbium absorption peak or band associated with the wavelength range of 970 nm to 980 nm.

According to further examples of the disclosed technology, laser diode packages include a heat conductive housing, a first plurality of diode lasers situated to emit corresponding laser beams having a first wavelength range, a second plurality of diode lasers situated to emit corresponding laser beams having a second wavelength range different from the first wavelength range, a wavelength multiplexer situated to receive the first and second pluralities of laser beams and to combine the laser beams based on the difference between first and second wavelength ranges, focusing optics situated to receive and focus the combined laser beams, and an output fiber situated to receive the focused combined laser beams. In some examples, laser diode packages further include a first polarization multiplexer situated to receive and combine a first subset of the first plurality of laser beams having a first polarization state and a second subset of the first plurality of laser beams having a second polarization state orthogonal to the first polarization state so as to produce a first set of polarization multiplexed laser beams that are directed to the wavelength multiplexer, and a second polarization multiplexer situated to receive and combine a first subset of the second plurality of laser beams having a first polarization state and a second subset of the second plurality of laser beams having a second polarization state orthogonal to the first polarization state so as to produce a second set of polarization multiplexed laser beams that are directed to the wavelength multiplexer.

According to additional examples of the disclosed technology, laser systems include a pump module situated to couple pump light in a first wavelength range and a second wavelength range different from the first wavelength range into a pump fiber, and a gain fiber having a core actively doped so as to have an absorption spectrum corresponding to the first and second wavelength ranges, the gain fiber situated to receive the pump light and to produce an output beam at an output wavelength. In some examples, the pump module includes a first plurality of diode lasers situated to generate a plurality of corresponding diode laser pump beams with wavelengths in the first wavelength range and a second plurality of diode lasers situated to generate a plurality of corresponding diode laser pump beams with wavelengths in the second wavelength range, and the first plurality of diode laser pump beams are polarization multiplexed and the second plurality of diode laser pump beams are polarization multiplexed and the first plurality of polarization multiplexed diode laser pump beams are wavelength multiplexed with the second plurality of polarization multiplexed diode laser pump beams.

The foregoing and other objects, features, and advantages of the disclosed technology will become more apparent from the following detailed description, which proceeds with reference to the accompanying figures.

DETAILED DESCRIPTION

Figure 1A:
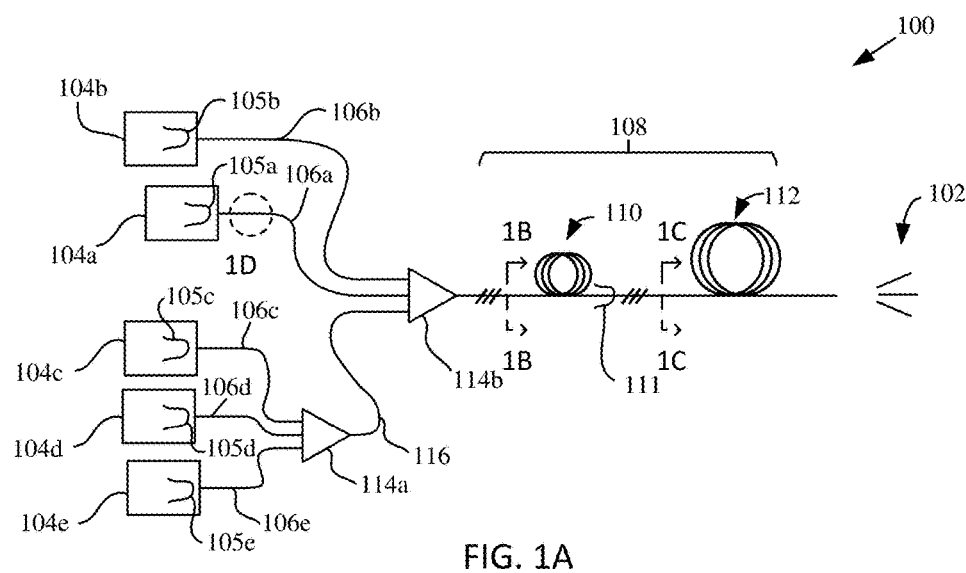
FIGS. 1A-1D show a schematic and representative cross-sections of a fiber laser system pumped at a plurality of wavelengths.
Figure 1B:
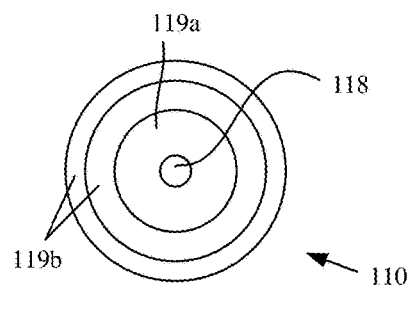

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatus' are referred to as "lowest," "best," "minimum," or the like. It will be appreciated that such descriptions are intended to indicate that a selection among many used functional alternatives can be made, and such selections need not be better, smaller, or otherwise preferable to other selections.

As used herein, diode beam refers to electromagnetic radiation at wavelengths of between about 100 nm and 10 µm, and typically between about 500 nm and 2 µm. Examples based on available laser diode sources and optical fibers generally are associated with wavelengths of between about 800 nm and 1700 nm. In some examples, propagating optical radiation is referred to as one or more beams having diameters, asymmetric fast and slow axes, beam cross-sectional areas, and beam divergences that can depend on beam wavelength and the optical systems used for beam shaping. For convenience, optical radiation is referred to as light in some examples, and need not be at visible wavelengths.

Typical laser diodes have emission regions having non-circular cross-sections. An emission region of a laser diode can be associated with a slow axis that is directed along a longest dimension of the emission region and a fast axis that is directed along a shortest dimension of the emission region. Along the slow axis, an emitted beam tends to have a smaller angular divergence than the angular divergence along the fast axis. In addition, the slow axis tends to be associated with beam propagation in more transverse modes than beam propagation in the fast axis so that a beam parameter product (corresponding to a product of an angular divergence and a beam dimension) measured along the slow axis is larger than that measured along the fast axis. Beam divergences and diameters along the slow axis, the fast axis, or both can be adjusted with one or more lenses, prisms, or mirrors to provide selected beam characteristics.

Representative embodiments are described with reference to optical fibers, but other types of optical waveguides can be used having square, rectangular, polygonal, oval, elliptical or other cross-sections. Optical fibers are typically formed of silica (glass) that is doped (or undoped) so as to provide predetermined refractive indices or refractive index differences. In some, examples, fibers or other waveguides are made of other materials such as fluorozirconates, fluoroaluminates, fluoride or phosphate glasses, chalcogenide glasses, or crystalline materials such as sapphire, depending on wavelengths of interest. Refractive indices of silica and fluoride glasses are typically about 1.5, but refractive indices of other materials such as chalcogenides can be 3 or more. In still other examples, optical fibers can be formed in part of plastics. In typical examples, a doped waveguide core such as a fiber core provides optical gain in response to pumping, and core and claddings are approximately concentric. In other examples, one or more of the core and claddings are decentered, and in some examples, core and cladding orientation and/or displacement vary along a waveguide length.

As used herein, numerical aperture (NA) refers to a largest angle of incidence with respect to a propagation axis defined by an optical waveguide for which propagating optical radiation is substantially confined. In optical fibers, fiber cores and fiber claddings can have associated NAs, typically defined by refractive index differences between a core and cladding layer, or adjacent cladding layers, respectively. While optical radiation propagating at such NAs is generally well confined, associated electromagnetic fields such as evanescent fields typically extend into an adjacent cladding layer. In some examples, a core NA is associated with a core/inner cladding refractive index, and a cladding NA is associated with an inner cladding/outer cladding refractive index difference. For an optical fiber having a core refractive index $n_{core}$ and a cladding index $n_{clad}$, a fiber core NA is NA=$\sqrt{n_{core}^2-n_{clad}^2}$. For an optical fiber with an inner core and an outer core adjacent the inner core, a cladding NA is NA=$\sqrt{n_{inner}^2-n_{outer}^2}$, wherein $n_{inner}$ and $n_{outer}$ are refractive indices of the inner cladding and the outer cladding, respectively. Optical beams as discussed above can also be referred to as having a beam NA which is associated with a beam angular radius. While multi-core step index fibers are described below, gradient index designs can also be used.

In the examples disclosed herein, a waveguide core such as an optical fiber core is doped with a rare earth element such as Nd, Yb, Ho, Er, or other active dopants or combinations thereof. Such actively doped cores can provide optical gain in response to optical or other pumping. As disclosed below, waveguides having such active dopants can be used to form optical amplifiers, or, if provided with suitable optical feedback such as reflective layers, mirrors, Bragg gratings, or other feedback mechanisms, such waveguides can generate laser emissions. Optical pump radiation can be arranged to co-propagate and/or counter-propagate in the waveguide with respect to a propagation direction of an emitted laser beam or an amplified beam. Optical pump radiation can be launched from a one or more ends of a fiber laser, including from one or both ends of a fiber laser having only first and second ends, and/or at various locations along the fiber laser.

The term brightness is used herein to refer to optical radiance which is typically defined as optical beam power per unit area per solid angle. In some examples, optical beam power is provided with one or more laser diodes that produce beams whose solid angles are proportional to beam wavelength and inversely proportional to beam area. Selection of beam area and beam solid angle can produce pump beams that couple selected pump beam powers into one or more core or cladding layers of double, triple, or other single or multi-clad optical fibers. Beam cross-sectional areas, diameters, or other dimensions can be described using boundaries that generally correspond to a zero intensity value, a 1/e value, a $1/e^2$ value, a full-width half-maximum (FWHM) value, or other suitable metric.

Optical beams and optical elements are described in some examples with respect to one or more axes. Typically, an axis includes one or more straight line segments along which an optical beam propagates or along which one or more optical elements are situated. Such axes can be bent or folded with reflective surfaces, so that axes need not be single straight line segments. Various coupling and collimation optics are described or may be used, and can include various lenses, including convex-convex, planoconvex, concave-concave, planoconcave, cylindrical, Fresnel, zone plates, holographic, spherical, aspheric, or combinations thereof. In convenient examples, cylindrical lenses have cylindrical surfaces that are arranged perpendicular to each other to provide a cross-cylinder or crossed-cylinder lens or lens assembly. In typical examples, planoconvex cylindrical lenses have a plano surface and a cylindrically convex surface that define focal axes that can be parallel to or collinear with an axial center of curvature associated with the cylindrically convex surface. Beams are typically incident to such lenses parallel to an optical axis that is perpendicular to the plano surface. Such beams tend to focus along an axis (e.g., slow axis, fast axis) perpendicular to the focal axes and optical axis, and collimated beams tend to brought to a focus with respect to that axis at the focal axis. It will be appreciated that focal axes can be other than straight, depending on the characteristics of the lens. In some multi-lens examples, such as cross-cylinder examples, a first and second objective are spaced apart along an optical axis and provide a set of corresponding focal axes which are perpendicular to each other and intersect each other at a focal plane.

FIGS. 1A-1D depict a laser system 100 situated to generate an output beam 102, typically having several kW of average power, including average powers of 5 kW or greater, before the onset of stimulated Raman scattering (SRS) in the laser system 100. The laser system 100 includes a plurality of pump modules 104a-104e providing high brightness pump beams 105a-105e with pump wavelengths $\lambda_a$-$\lambda_e$ and corresponding pump bandwidths $\Delta\lambda_a$-$\Delta\lambda_e$ in corresponding pump fibers 106a-106e. The pump modules 104a-104e include at least one pump diode module 104a that provides a pump beam 105a in a pump fiber 106a at a plurality of pump wavelengths, $\lambda_1$, $\lambda_2$, as shown FIG. 1D. The laser system 100 also includes a gain fiber 108 that is situated to receive the pump beams 105a-105e from pump modules 104a-104e and to generate the output beam 102. In some examples, the gain fiber 108 can be arranged in a master oscillator power amplifier (MOPA) configuration with an oscillator fiber 110 situated to generate a signal beam 111 and one or more amplifier fibers 112 coupled to the oscillator fiber 110 and situated to amplify the signal beam 111 so as to produce the output beam 102. The gain fiber 108 includes a core situated to generate and propagate the output beam 102 based on one or more active dopants present in the core, such as ytterbium.

The pump modules 104a-104e are typically coupled to the gain fiber with one or more fused fiber pump combiners, such as fused fiber pump combiners 114a, 114b, so that pump beams are directed to the gain fiber 108 so as to co-propagate or counter-propagate with respect to the output beam 102. For example, pump fibers 106c-e can be coupled to a first pump combiner 114a that provides a pump combiner output fiber 116 that can be coupled to a second pump combiner 114b downstream from the first pump combiner 114a. The pump module 104a generates the pump beam 105a with broad area laser diodes at a plurality of wavelengths ranges corresponding to absorption peaks, or absorption bands, of the active dopant or dopants in the core of the gain fiber 108. The pump modules 104b-104e can generate corresponding pump beams 105b-105e at the same or different wavelengths or wavelength ranges and can correspond to dopants of the gain fiber 108.

The gain fiber 108 is configured to generate the output beam 102 using the pump beams in both wavelength ranges. By generating the output beam 102 with pump beams at multiple absorption peaks, pump modules 104a can be used that can produce a substantially brighter pump beam output than conventional diode laser pump modules without requiring more complex pump architectures (e.g., fiber lasers as pump sources). With the brighter pump beam outputs, the corresponding average power of the output beam 102 can be scaled to 5 kW and higher without producing significant SRS effects, and with superior beam characteristics. In some examples, the output beam 102 is generated in a single, all-glass, gain fiber, without combining multiple lower power output beams generated from separate oscillators and amplifiers. In one example, a plurality of pump modules 104a are combined, each generating more than 250 W of laser pump power that is coupled into a pump fiber with a core having a 105 µm diameter and less than 0.16 NA.

Figure 1C:
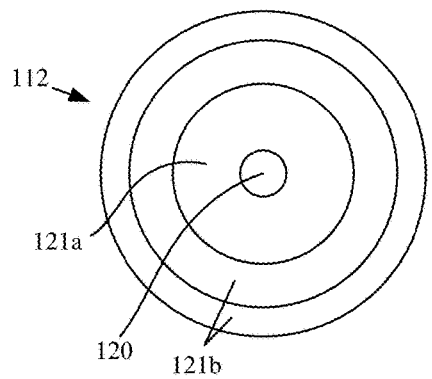
Figure 1D:
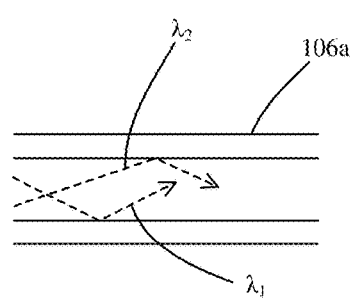

In a representative example of a laser system, such as the laser system 100, the oscillator fiber 110 receives over 7 kW of pump power that co-propagates through the oscillator fiber 110 and the amplifier fiber 112 with the output beam 102. It will be appreciated that a variety of pump coupling methods can be employed to couple pump beams into the gain fiber 108 to generate the output beam 102, and in some examples pump beams can counter-propagate or become coupled between or within gain fiber sections. The gain in oscillator fiber 110 is selected in relation to the gain in the amplifier fiber 112 so as to control or select temperatures and heating in different portions of the oscillator fiber 110 and amplifier fiber 112. For example, the core diameter, NA, length, and dopant concentration of the oscillator fiber 110 and amplifier fiber 112 can be varied independently to reduce localized heating in the gain fiber 108. In some examples, referring to FIG. 1B, the oscillator fiber 110 includes a single mode core 118 having a core diameter that is 10 µm, 12 µm, 14 µm, or 16 µm, though other diameters are possible. A cladding 119a surrounding the core 118 has a refractive index selected to ensure propagation of the signal beam 111. One or more other cladding layers and/or polymer layers 119b surround the cladding 119a. The signal beam 111 that is generated propagates in a single transverse mode and is coupled into the amplifier fiber 112 with a fiber splice, mode field adapter, free-space optics, or other coupling mechanism. Referring to FIG. 1C, the amplifier fiber 112 typically has a core 120 with a diameter larger than the core 118 of the oscillator fiber 110. A cladding 121a surrounds the core 120, with the core 120 and cladding 121a defining a single mode or few mode optical fiber. One or more other cladding layers and/or polymer layers 121b surround the cladding 121a.

Figure 2:
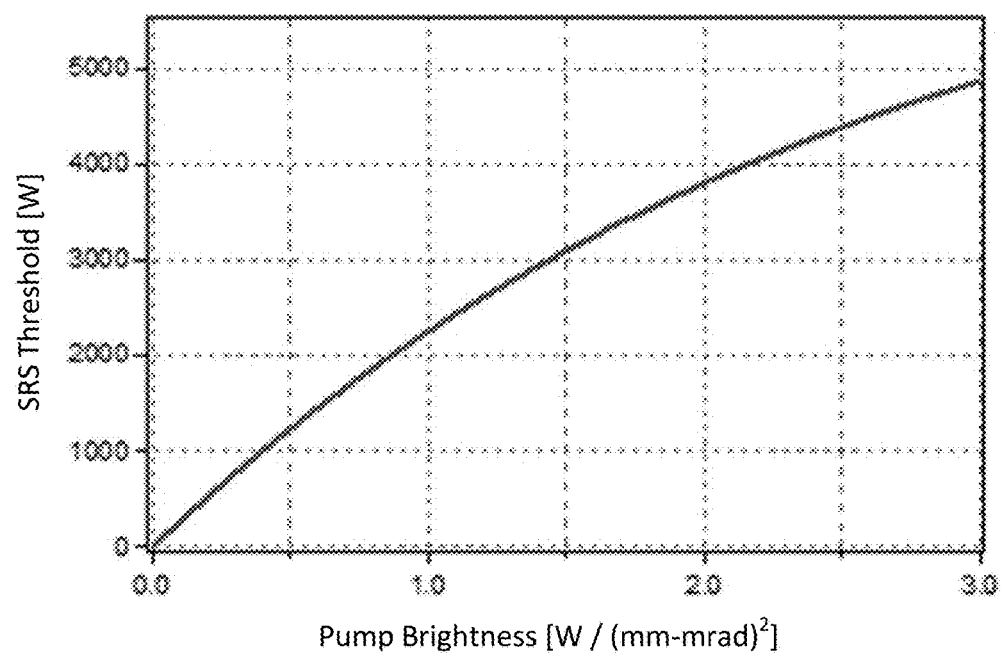
FIG. 2 is a chart depicting SRS threshold with respect to pump brightness in one example fiber laser configuration.

FIG. 2 illustrates stimulated Raman scattering (SRS) power threshold as a function of pump module brightness for a representative fiber laser design. For fiber lasers and amplifiers, an SRS power threshold is typically proportional to core area and inversely proportional to fiber length. However, as pump modules become brighter, a gain fiber core area can be allowed to increase based on a lower NA of the brighter pump source while maintaining beam quality of the output beam, and the length of the gain fiber can be allowed to decrease as the pump power increases for a given NA with the brighter pump source. Thus, an increase in pump brightness can correspond with a higher SRS threshold, allowing a more powerful continuous-wave output beam for a given laser system configuration. In some examples, as the power of the output beam increases, the beam quality of the output beam can be maintained or can decrease by an acceptable amount in relation to the power increase.

As discussed above, examples of continuous-wave fiber lasers systems, such as laser system 100, typically use fused fiber combiners, such as the first and second pump combiners, 114a, 114b. Systems using fused fiber combiners generally perform better with high brightness pump modules, and pump fibers can have various core diameters, such as 50 µm, 62.5 µm, 105 µm, 150 µm, 200 µm, etc. Pump fibers typically have NAs that are selected based on the particular laser process, such as fiber NAs of approximately 0.08, 0.10, 0.12, 0.15, 0.18, 0.22, etc. Fused fiber combiners typically include an input diameter where multiple pump fibers can be coupled to receive corresponding pump beams and an output diameter that can be smaller than the input diameter and that receives the coupled pump beams.

For fiber laser systems, design considerations include the pump fiber core diameter and NA that reduce loss inside associated fused pump fiber combiners, in order to improve overall CWFL reliability. Additionally, as the average power increases for the output beam generated in some high power continuous-wave laser system designs (e.g., laser systems generating output beams greater than about 2 kW), higher brightness pump modules may be desirable or required. For example, since pump brightness has a somewhat linear relationship to SRS threshold as shown in FIG. 2, and the SRS threshold is inversely proportional to gain fiber length, brighter pump sources can allow a reduced gain fiber length so as to increase the SRS threshold and thresholds for other nonlinear effects. Thus, in many laser system examples, in order to allow output beam power levels to continue to scale upwards, the brightness of the pump modules should also increase. However, using diode laser package pump sources typically have a practical limit on the brightness available for coupling into associated pump fibers.

Figure 3:
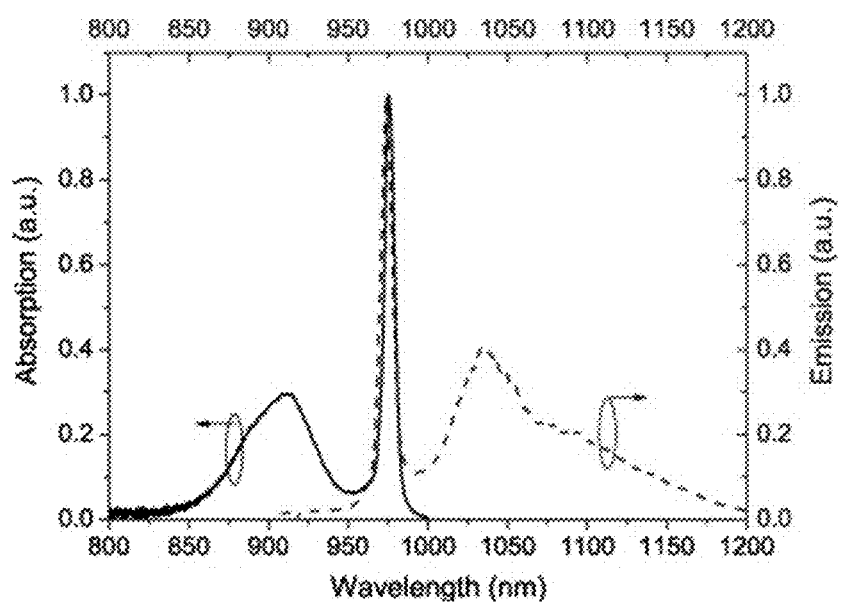
FIG. 3 is a chart of absorption and emission with respect to wavelength for ytterbium-doped fiber.

For example, FIG. 3 shows relative absorption and emission for ytterbium as a function of wavelength. If the gain fiber 108 is ytterbium doped, then the pump module 104a can generate the pump beam 105a in a first wavelength range, between about 900 nm and 930 nm and corresponding to a relatively broad absorption peak centered around 915 nm, and in a second wavelength range, between about 970 nm and 980 nm and corresponding to a relatively narrow absorption peak centered at about 976 nm and that has a normalized absorption coefficient more than 300% larger than the relatively broad absorption peak centered around 915 nm.

Figure 4A:
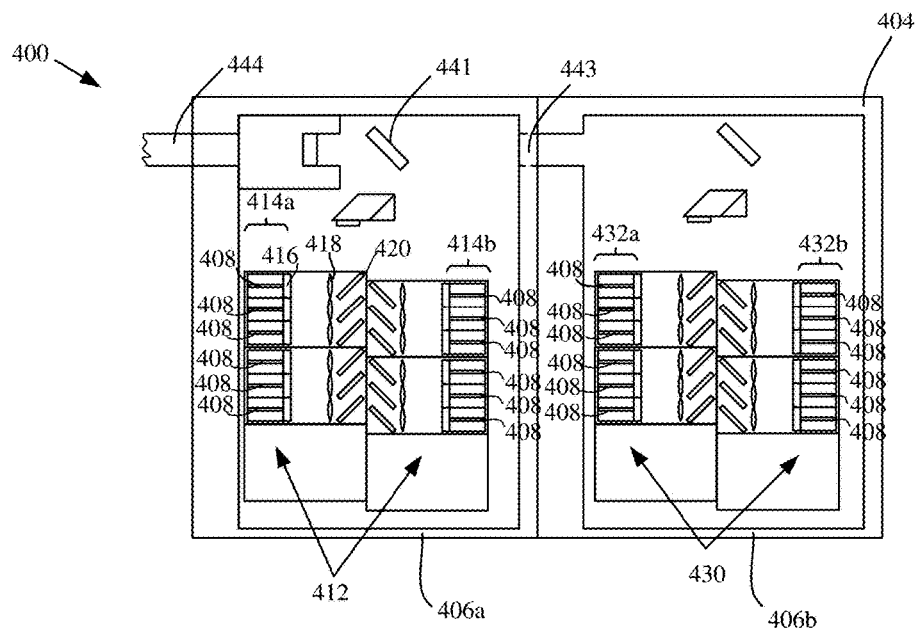
FIG. 4A is a plan view of a pump diode package.
Figure 4B:
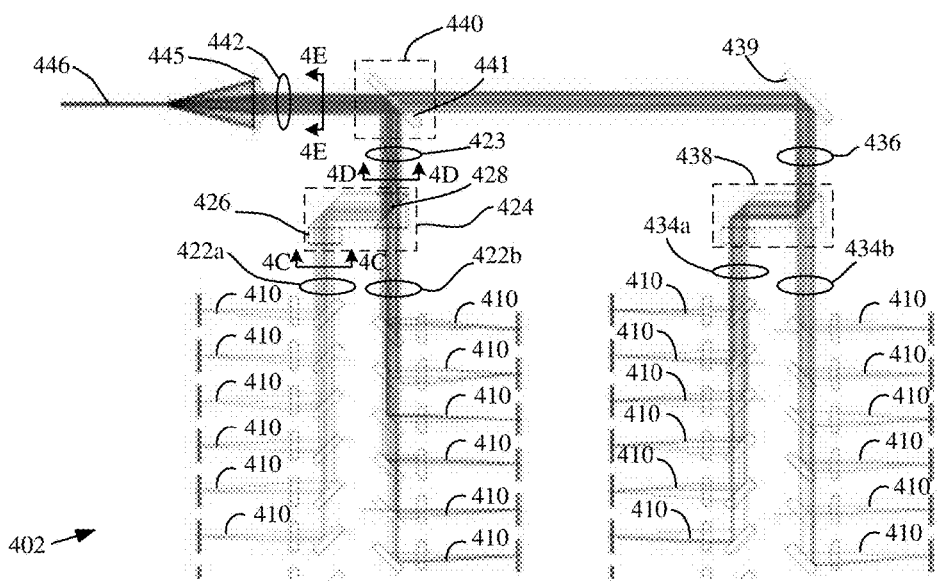
FIG. 4B is a ray trace of the pump diode package in FIG. 4A in the same plan view.

In FIGS. 4A and 4B, an example of a laser diode package 400 and corresponding diode beam ray trace 402 are shown. The laser diode package 400 includes a housing 404 that can include similar housing portions 406a, 406b for housing an arrangement of laser diodes 408 situated to produce corresponding diode beams 410. The housing 404 is typically made of one or more thermally conductive materials, such as copper, in order to direct the considerable heat generated during the operation of the laser diodes 408 away from the laser diode package 400 and to protect the various internal components of the laser diode package 400. A first set of laser diodes 412 includes two subsets 414a, 414b of six laser diodes 408 with the first subset 414a situated to emit diode beams 410 in an opposite direction from the second subset 414b. The first set of laser diodes 412 is configured to emit diode beams 410 in a first wavelength range $\lambda_1$. As shown in FIG. 4A, the first wavelength range $\lambda_1$ is between about 900 nm and 930 nm, and more typically between about 910 nm and 920 nm, often with a center wavelength at about 915 nm. The first wavelength range $\lambda_1$ can coincide with an absorption peak of a downstream gain fiber, such as the broad absorption peak for ytterbium centered at around 915 nm. The housing 404, housing portions 406a, 406b, laser diodes 408, or other components of the laser diode package 400 can be temperature controlled with one or more liquid or Peltier cooling systems. In some examples, temperature controlling can allow control over a wavelength drift associated with $\lambda_1$, $\lambda_2$, or other laser diode wavelength ranges.

Figure 4C:
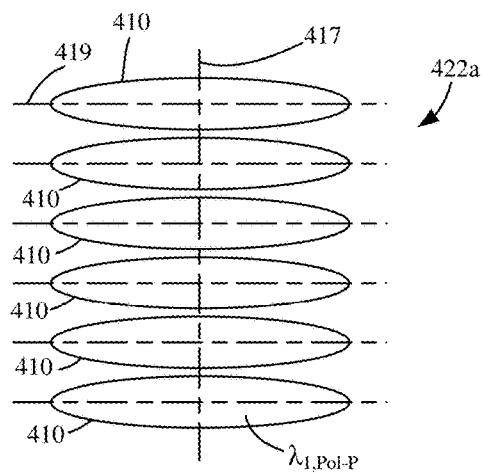
FIGS. 4C-4E are cross-sections of propagating diode beams of the ray trace in FIG. 4B, before propagation through a focusing lens.

Each laser beam is received by a corresponding fast axis collimator 416 that collimates along a fast axis 417 of the diode beam 410, a slow axis collimator 418 that collimates along a slow axis 419 of the diode beam 410, and a turning mirror 420 situated to turn the direction of the diode beam 410. The diodes of the first subset 414a are each spaced apart from the other adjacently and also in height, e.g., out of the plane of FIG. 4A, to form a stepped arrangement with laser diode 408 near the bottom of FIG. 4A positioned highest and the laser diode 408 near the top of FIG. 4A positioned lowest. The diodes of the second subset 414b are situated similarly but emit beams in the opposite direction, as shown in FIG. 4B. Beam stacks 422a, 422b are formed after the diode beams 410 are turned so that each beam slow axis in a stack is parallel to each other beam slow axis, with adjacent beam slow axes being spaced apart by the height difference between adjacent laser diodes. FIG. 4C shows a cross-section of the beam stack 422a that includes six diode beams 410 that are collimated in their fast and slow axes 417, 419. In various examples, diode beams 410 that become stacked are spaced apart from each other in the fast axis 417 or slow axis 419. In general, boundaries of diode beams 410 correspond to $1/e$, $1/e^2$, or other intensity or power values of the beam.

Figure 4D:
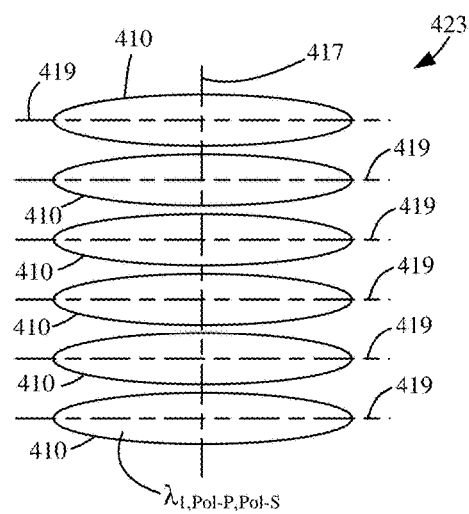

The beam stacks 422a, 422b are received by a polarization multiplexer 424 that can include a half-wave plate 426 and a polarizing beam splitter 428. The beam stack 422a is received by the half-wave plate 426 that rotates a p-polarization state of the diode beams 410 of the beam stack 422a into an s-polarization state. The beam stack 422a that is s-polarized then reflects at the internal surfaces of the polarizing beam splitter 428, and the beam stack 422b that remains p-polarized transmits through the polarizing beam splitter 428 so that the beam stacks 422a, 422b overlap each other to form a polarization multiplexed beam stack 423, as shown in FIG. 4D. In some examples, the beam stacks 422a, 422b of the polarization multiplexed beam stack 423 include beams of varying size or shape and do not precisely overlap as shown in FIG. 4D.

Figure 4E:
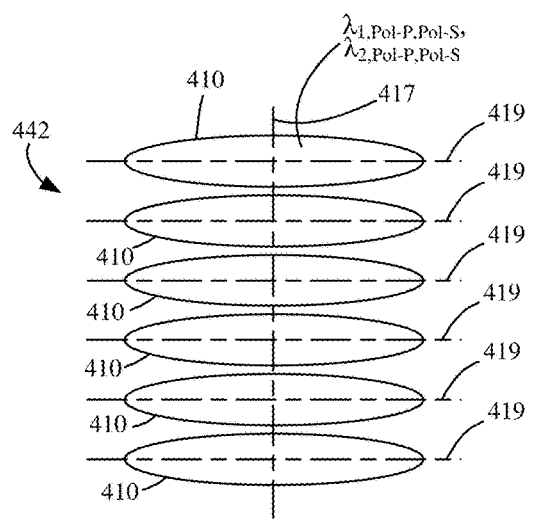

A second set of laser diodes 430 situated in housing portion 406b includes first and second subsets 432a, 432b of six laser diodes 408 arranged similarly to the first set of laser diodes 412. The laser diodes 408 of the second set 430 are configured to emit beams in a second wavelength range $\lambda_2$ that is different from the first wavelength range $\lambda_1$. In some examples, the second wavelength range is between about 970 nm and 980 nm and is associated with an absorption peak of a gain fiber, such as the narrow absorption peak for ytterbium centered at around 976 nm. Beam stacks 434a, 434b are formed similar to beam stacks 422a, 422b and are polarization multiplexed with a polarization multiplexer 438 to form a polarization multiplexed beam stack 436. The polarization multiplexed beam stack 436 is directed by a mirror 439 to a wavelength multiplexer 440. The wavelength multiplexer 440 includes a dichroic beam combiner 441 configured to reflect in the first wavelength range $\lambda_1$ and to transmit in the second wavelength range $\lambda_2$. The dichroic beam combiner 441 is situated to receive and reflect the beam stack 423 and to receive and transmit the beam stack 436 so as to form a combined beam stack 442, shown in FIG. 4E, that is polarization and wavelength multiplexed. In some examples, the beam stacks 423, 436 of the polarization and wavelength multiplexed beam stack 442 include beams of varying size or shape and do not overlap as shown in FIG. 4E. In further examples, beam characteristics are different between beam stacks 423, 436, such as NA, brightness, beam compression, beam spacing, collimated beam size or shape, focused beam spot size, etc.

The combined beam stack 442 is coupled into an optical fiber 444 with an objective lens 445, or other suitable coupling optic or set of coupling optics, for subsequent application, such as fiber laser pumping or direct diode application. The dichroic beam combiner 441 can be a long pass filter configured to reflect shorter wavelengths, such as the first wavelength range $\lambda_1$, and to transmit longer wavelengths, such as the second wavelength range $\lambda_2$. In further examples, the dichroic beam combiner 441 can be a short pass filter configured to transmit shorter wavelengths and to transmit longer wavelengths. The dichroic beam combiner 441 can also be configured to propagate beams that are s-polarized and beams that p-polarized, as shown in FIG. 4B. In further examples, the dichroic beam combiner 441 can be configured to transmit or reflect specific polarizations or to transmit or reflect all polarizations. In some examples, the housing portion 406b can have similar shape and construction as the housing portion 406a, which can simplify construction of the laser diode package 400 and provide modularity so that laser diode packages of different outputs can be formed. In one example, housing portion 406a is a substantial copy of housing portion 406b except an aperture 443 is formed in housing portion 406a, so as to provide an optical path for the beam stack 436 to the dichroic beam combiner 441. It will be appreciated that modular and non-modular examples are possible. For example, the housing portions 406a, 406b can form a singular housing, and some examples of singular housings can be made without interior separating walls or aperture 443.

The optical fiber 444 is typically a multimode fiber having a core and NA selected in relation to the arrangement of laser diodes 408. Pump modules often have an overall brightness that is determined based on the number of separate diode laser emitters that can be spatially located so that corresponding beams can be coupled within a predetermined NA of a multimode fiber with acceptable losses. Spatially locating emitters and corresponding beams is typically limited to a predetermined quantity of laser diode emitters, for example, by geometrically multiplexing beams along a fast axis as shown in FIG. 4A or in the slow axis by positioning a beam stack, such as the beam stack 422b, adjacent to the beam stack 422a. Including additional emitters over the predetermined quantity typically increases the NA of the corresponding beams beyond what is acceptable for the optical fiber 444 or the corresponding pumping application. In some examples, the optical fiber 444 has a 105 µm core diameter and a 125 µm cladding diameter with an NA of about 0.15. Six to nine diode beams 410 can be geometrically multiplexed in the fast axis 417 and coupled into the optical fiber 444 before exceeding the corresponding NA of the optical fiber 444 and the high power constraints associated with the components of a corresponding high power fiber laser system that is pumped by the laser diode package 400. It will be appreciated that other quantities of diode beams may be geometrically multiplexed depending on the characteristics of the diode lasers, such as emitter height, fast axis and slow axis beam performance, etc.

By including polarization multiplexing and wavelength multiplexing, the laser diode package 400 can provide an output pump beam 446 in the optical fiber 444 with a brightness that is quadrupled as compared to pump module examples with output pump beam formed by geometric multiplexing, and doubled as compared to pump module examples using geometric and polarization multiplexing. For example, a pump module with two sets of six polarization multiplexed emitters can produce 150 W of pump beam power at 15 A of current into 0.15 NA output fiber, providing a pump beam brightness of about 2.42 W/(mm-mRad)$^2$. By using four sets of six diode beams 410 that are polarization multiplexed, e.g., forming the beam stacks 423, 436, and wavelength multiplexed, e.g., forming beam stack 442, twenty-four diode beams 410 providing a pump beam output power of 282 W at 15 A, can be coupled into the optical fiber 444 with a 105 µm core diameter and 0.15 NA, for a brightness of 4.6 W/(mm-mRad)$^2$. The laser diode package 400 providing the output pump beam 446 with such a brightness can be used to pump fiber laser systems, such as the laser system 100 shown in FIG. 1, so as to produce fiber laser system output beams with continuous wave average powers of greater than 3 kW, including 4 kW, 5 kW, 6 kW, or greater. In typical examples, wavelength ranges associated with the wavelength multiplexed beams of the laser diode package 400 corresponds with separate absorption peaks (depicted in FIG. 3) in an active fiber of the fiber laser system. As the brightness of the light coupled by the laser diode package increases, direct application of the light to a target in various laser processes becomes more practical. In some examples, higher brightness beams are possible based on improvements in diode laser technology. Based on the module and beam multiplexing configurations herein, a brightness of 5.0, 6.0, 8.0 W/(mm-mRad)$^2$, or even higher can be achieved. Further increases in brightness to 10.0, 12.0, 15.0 W/(mm-mRad)$^2$, and higher, are possible based on further improvement in diode laser technology and the brightness of the individual diode laser beams.

Figure 5:
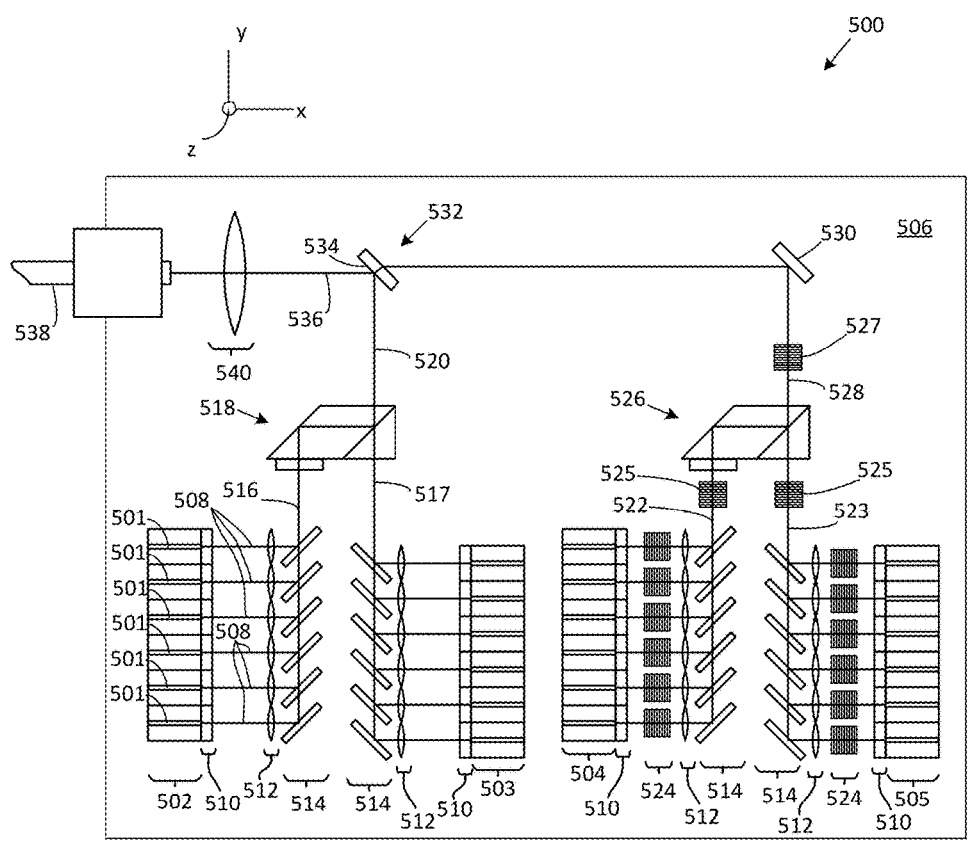
FIG. 5 is a schematic of a pump diode package.

FIG. 5 is a multi-wavelength diode module 500 that includes diode lasers 501 situated in four groups 502, 503, 504, 505 mounted in a housing 506 and situated to emit corresponding diode beams 508. While four columns of six diode lasers 501 are shown in for the module 500, other configurations including additional columns are possible, such as from three to eight columns in some practical examples, with each column having from three to nine diode lasers 501. The diode beams 508 of the first and second groups 502, 503 are emitted in a first wavelength range of about 900 nm to 930 nm and the diode beams 508 of the third and fourth groups 504, 505 are emitted in a second wavelength range of about 970 nm to 980 nm. The diode beams 508 in each group are emitted at successive heights in the z-axis so that when the diode beams 508 become turned the diode beams 508 propagate in a collimated beam stack. Each of the diode beams 508 of the first and second groups 502, 503 is collimated with a fast axis collimator 510 along the fast axis of the diode beam 508, which is parallel to the z-axis in FIG. 5. The corresponding diode beam 508 is collimated with a slow axis collimator 512 along the slow axis of the diode beam 508, which is parallel to the y-axis in FIG. 5. The corresponding diode beam 508, now collimated, is turned with a turning mirror 514 to propagate parallel to the y-axis so that beam stacks 516, 517 are formed for the diode beams of the respective groups 502, 503. The beam stacks 516, 517 are polarization multiplexed with a polarization multiplexer 518 to form a polarization multiplexed beam stack 520 so that the polarization multiplexed beam stack 520 has an increased brightness as compared to the individual beams stacks 516, 517.

Each of the diode beams 508 of the third and fourth groups 504, 505 is collimated with respective fast and slow axis collimators 510, 512 and turned with respective turning mirror 514 to form beam stacks 522, 523. Each of the diode beams 508 of the third and fourth groups 504, 505 is also partially reflected with a respective wavelength selective grating 524 situated between the respective fast and slow axis collimators 510, 512. In typical examples the wavelength selective grating 524 is a volume Bragg grating having Bragg grating parameters selected so as to lock the wavelength of the emitting diodes by providing selective wavelength back in to the laser diodes. The beam stacks 522, 523 are polarization multiplexed with a polarization multiplexer 526 to form a polarization multiplexed beam stack 528 so that the polarization multiplexed beam stack 528 has an increased brightness as compared to the individual beams stacks 522, 523.

In some examples, a wavelength selective grating is situated in alternative locations. For example, wavelength selective gratings 525 can be situated to receive the beam stacks 522, 523, or a wavelength selective grating 527 can be situated to receive the polarization multiplexed beam stack 528, and the wavelength selective gratings 524 situated between respective fast and slow axis collimators 510, 512 can be omitted. The wavelength selective grating 524 can be situated between the respective slow axis collimator 512 and the turning mirror 514 instead of between the respective fast and slow axis collimators 510, 512, or it can be situated in other locations. In some examples, a wavelength selective grating is situated internal to the diode lasers 501 of the third and fourth groups 504, 505 or a wavelength grating is coupled directly to respective emitting facets of the diode lasers 501.

The polarization multiplexed beam stack 528 is turned by a turning mirror 530 and is received by a wavelength multiplexer 532, and the polarization multiplexed beam stack 520 is also received by the wavelength multiplexer 532. The wavelength multiplexer includes a dichroic element 534, that transmits and refracts the beam stack 528 and reflects the beam stack 520 based on the unique wavelength ranges of the beam stacks 520, 528, so as to form a wavelength multiplexed beam stack 536. The wavelength multiplexed beam stack 536 is coupled into an output fiber 538 with coupling optics 540, such as an objective lens or multi-element objective. In various examples, diode beams 508 of the wavelength multiplexed beam stack can be compressed or altered so as to improve coupling performance into the optical fiber 538. In some examples, additional wavelength multiplexers 532 are used to transmit or reflect wavelengths different from the first and second wavelength ranges so that additional columns of diode lasers 501 can be wavelength multiplexed. Typically, such examples further increase brightness coupled into an output fiber and the wavelength ranges of the coupled optical radiation corresponds with absorption bands of ytterbium or other active dopants. Gain fibers as well as other solid state gain media (e.g., bulk crystals) can be pumped.

Figure 6:
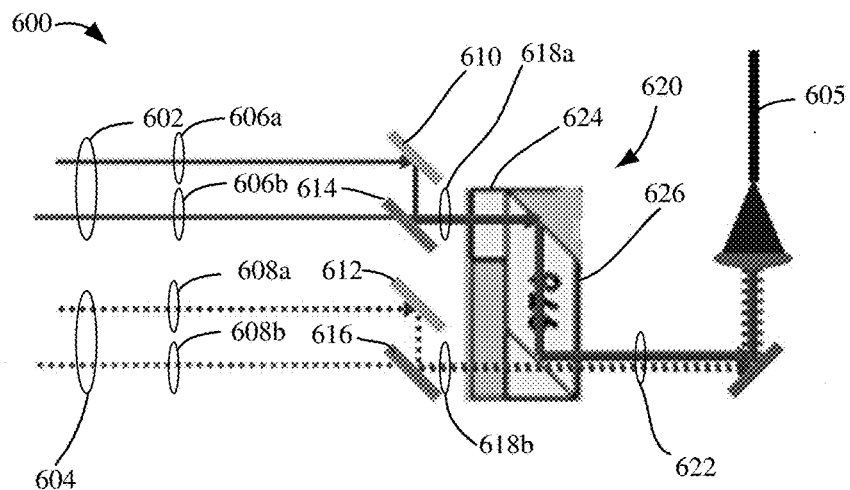
FIG. 6 is a plan view of a portion of another pump diode package.

FIG. 6 shows an embodiment of a pump module 600 situated to couple first and second sets 602, 604 of diode beams into an output fiber 605. The first set 602 includes a first subset 606a of diode beams that have a first wavelength range $\lambda_1$ and a second subset 606b of diode beams that have a second wavelength range $\lambda_2$ different from the first wavelength range $\lambda_1$. The second set 604 includes a first subset 608a of diode beams that have the first wavelength range $\lambda_1$ and a second subset 608b of diode beams that have the second wavelength range $\lambda_2$. The first subsets 606a, 608a are received by respective turning mirrors 610, 612 that are situated to direct the respective subsets 606a, 608a to respective dichroic elements 614, 616. The dichroic elements 614, 616 are situated to reflect respective first subsets 606a, 608a and to transmit respective second subsets 606b, 608b to form wavelength multiplexed beam stacks 618a, 618b. The wavelength multiplexed beam stacks 618a, 618b are received by a polarization multiplexer 620 so as to form a combined beam stack 622 that is both polarization multiplexed and wavelength multiplexed. The polarization multiplexer 620 includes a half-wave optic 624 situated to rotate a polarization state of the diode beams of the first set 602 and a right angle prism 626 situated to jog the diode beams of the first set 602 so as to overlap the diode beams of the second set 604 to form the combined beam stack 622. A turning mirror 628 and an objective lens 630 are situated to receive the combined beam stack 622 and to couple the combined beam stack 622 into the output fiber 605.

Figure 7:
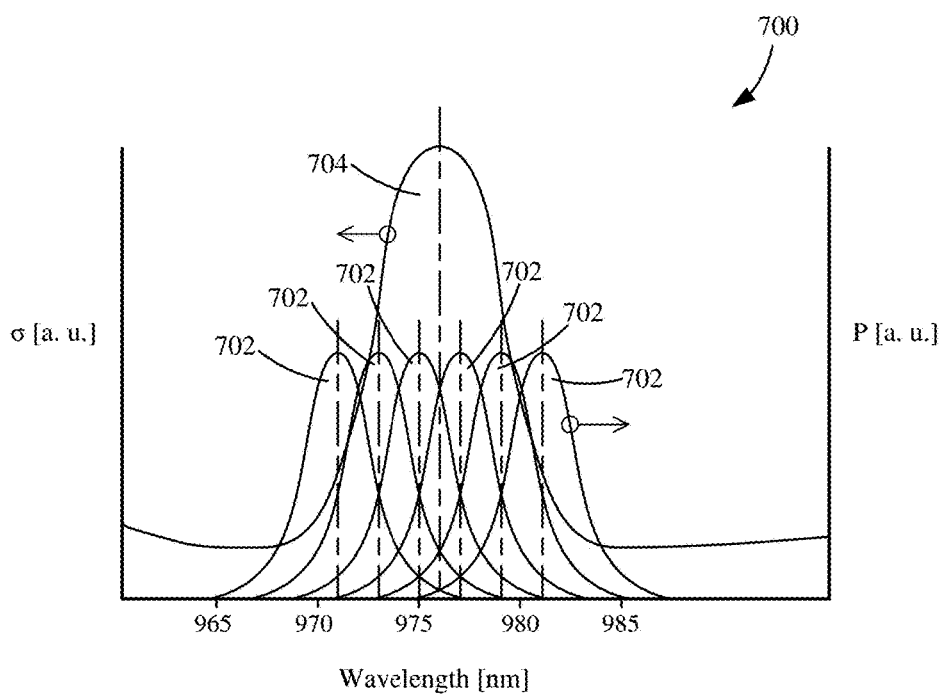
FIG. 7 is a graph of diode beam wavelength compared with active dopant absorption cross-section.

FIG. 7 is a graph 700 of absorption cross-section of ytterbium and diode power as a function of wavelength. As shown in the graph 700, diode beams 702 have a similar output power but have center wavelengths generally spaced apart from each other. The diode beams typically have an unlocked full-width half maximum wavelength spread of about 4 nm, though such amounts can vary from diode to diode. In some pump module examples, the center wavelength associated with the diode beams generated by the pump module can be spaced apart in relation to a corresponding absorption peak 704, such as the narrow absorption peak for ytterbium at approximately 976 nm, including being positioned outside the wavelength range (e.g., at positions where an absorption cross-section is at or below ½, ⅓, ⅕, or lower, of a peak absorption) associated with the absorption peak 704. A downstream gain fiber of a fiber laser system can be pumped with the diode beams 702 with spaced apart center wavelengths so that during operation of the fiber laser system, as fiber laser component temperatures and diode laser current levels vary, absorption variation at the absorption peak 704 can fluctuate by a reduced amount. A natural variation in the unlocked center wavelength of diode beams 702 can be used to more reliably provide power in-band to pump a corresponding fiber laser system.

In some examples, unlocked wavelength centers of diode lasers in the 800 nm to 1000 nm range exhibit temperature dependent wavelength center red-shift from about 0.1 to 0.5 nm/° C., 0.2 to 0.6 nm/° C., 0.25 to 0.4 nm/° C., or other variations. In one particular example, unlocked diode lasers vary approximately between 0.28 nm/° C. and 0.35 nm/° C. Locked examples typically vary by less than about 0.02 nm/° C., 0.002 nm/° C., 0.0002 nm/° C., or less. Diode lasers can also experience wavelength center variation based on current levels, which can be in the range of 0.2-2.0 nm/A, 0.3-1.5 nm/A, and more typically in the range of about 0.4 to 1.1 nm/A. Manufactured diode lasers typically exhibit a distribution of wavelength centers that can be separated and grouped so that a predetermined wavelength center distribution can be selected for placement in diode laser modules. Selected wavelength center distributions can produce an in-band power during pumping or direct diode laser processing that remains constant or varies by a reduced amount, including as commanded laser output varies or component temperature varies due to commanded laser output, external environmental factors, internal temperature variation, component failures, etc. For example, a selected wavelength center distribution can be selected relative to an absorption peak to have a center-weight, a uniform weight, a non-uniform weight, a skewed weight, a shifted weight, etc.

Figure 8:
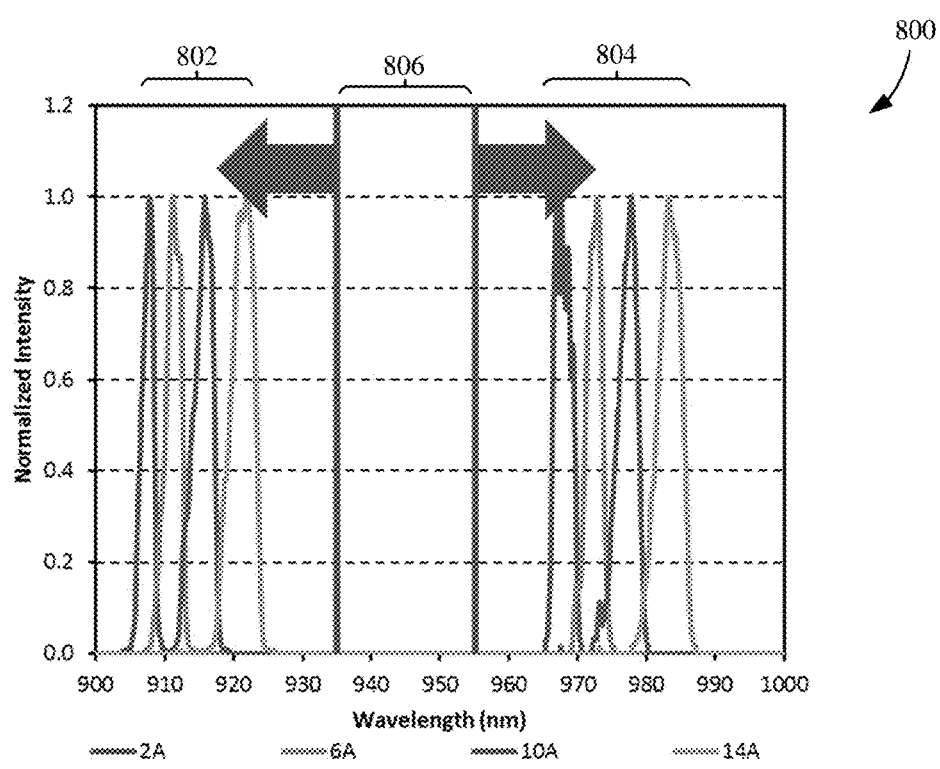
FIG. 8 is a graph of diode beam intensities and wavelength for a laser diode package at different operating currents.

In FIG. 8, a graph 800 is shown of normalized intensity for a diode laser beam 802 operating at four increasing levels of current (2 A, 6 A, 10 A, and 14 A) and in the wavelength range of between about 900 nm and 930 nm, and for a diode laser beam 804 operating at the same four increasing levels of current and in the range of about 965 nm and about 995 nm. Dichroic elements used to combine diode laser beams of different wavelengths, such as the diode laser beams 802, 804, are typically coated with a reflectivity coating that provides reflectivity for a predetermined wavelength range and transmissivity for another predetermined wavelength range. Dichroic element coatings can be provided with spectral characteristics that include a reflectivity spectrum offset from a lower bound or upper bound of a corresponding wavelength range to be reflected (or transmitted) so that a spectral buffer 806 is provided for wavelength multiplexed beams. For example, the dichroic element may have a reflectivity at about 935 nm and a transmissivity at about 955 nm to accommodate polarization multiplexed beams having different reflectivity or transmissivity response at the dichroic element.

Figure 9:
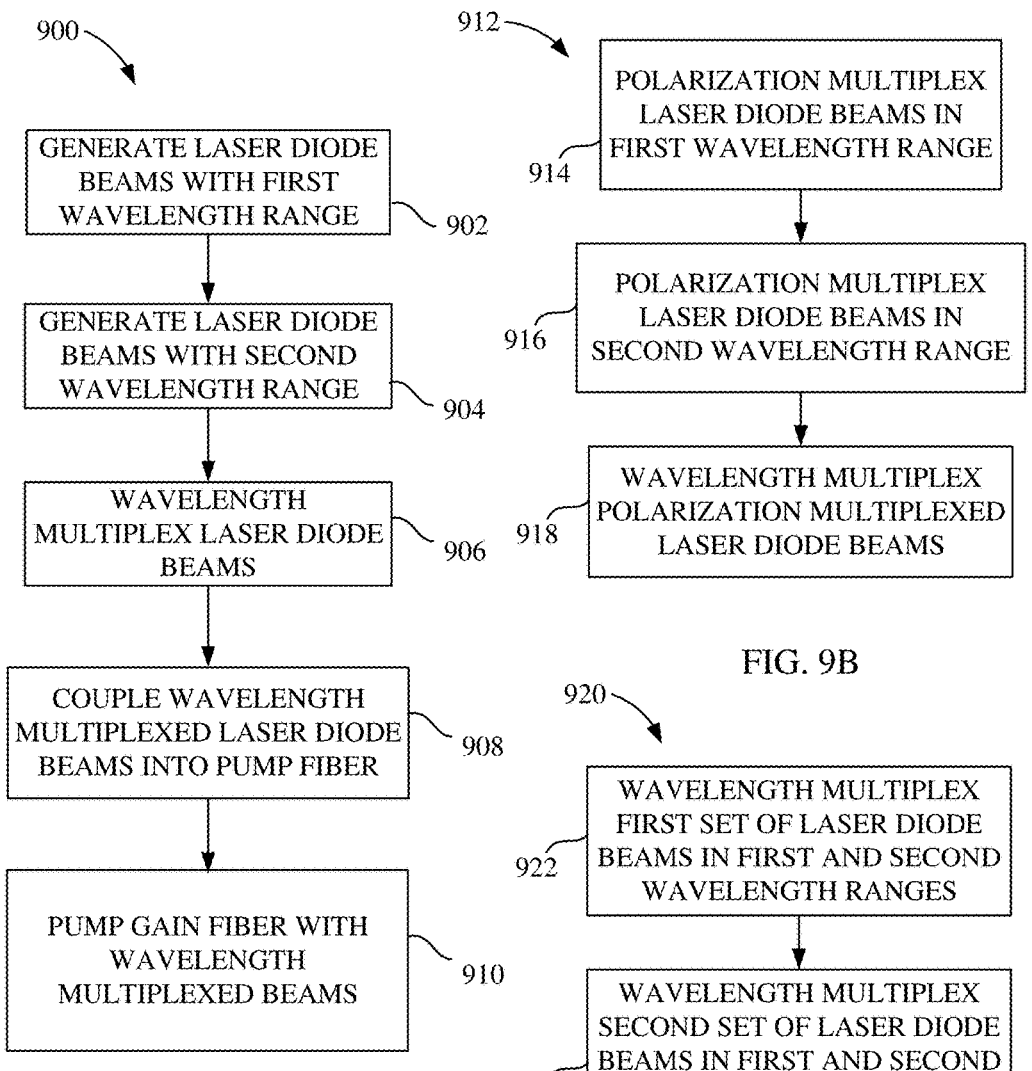
FIGS. 9A-9C are flowcharts of methods of increasing brightness through wavelength and polarization multiplexing.

FIG. 9A is an example of a method 900 that includes, at a method act 902, generating laser diode beams with first wavelength range in a pump module, and at a method act 904, generating laser diode beams with a second wavelength range that is different from the first wavelength range and in the same pump module. In a method act 906, the laser diode beams having the first wavelength range are multiplexed with the laser diode beams having the second wavelength range. At a method act 908, the wavelength multiplexed laser diode beams are coupled into a pump fiber. At a method act 910, a gain fiber receives and is pumped by the wavelength multiplexed laser diode beams. In some examples, the first and second wavelength ranges correspond to different absorption peaks associated with the gain fiber pumped by the wavelength multiplexed laser diode beams. In further examples, beams are polarization multiplexed before wavelength multiplexing.

In the example method shown in FIG. 9B, at a method act 914, a first plurality of laser diode beams in the first wavelength range are polarization multiplexed with a second plurality of laser diode beams in the first wavelength range having a polarization orthogonal or nearly orthogonal to the first plurality of laser diode beams in the first wavelength range. At a method act 916, a first plurality of laser diode beams in the second wavelength range can also be polarization multiplexed with a second plurality of laser diode beams in the second wavelength range having a polarization orthogonal or nearly orthogonal to the first plurality of laser diode beams in the second wavelength range. The polarization multiplexed beams are then wavelength multiplexed at a method act 918.

In an alternative method example 920, shown in FIG. 9C, a first set of laser diode beams in the first wavelength range, at a method act 922, is wavelength multiplexed with a first set of laser diode beams in the second wavelength range, and a second set of laser diode beams in the first wavelength range, at a method 924, is wavelength multiplexed with a second set of laser diode beams in the second wavelength range. At a method act 926, the first sets wavelength multiplexed laser diode beams are polarization multiplexed with the second sets of wavelength multiplexed laser diode beams.

In additional examples, optical beams are generated from diode lasers are generated at multiple wavelengths that correspond to absorption lines, peaks, or bands of material of a target and the optical beams are polarization and wavelength multiplexed and coupled into an optical fiber so as to produce a high brightness combined beam that is directed to the target. Examples of material processes for the high brightness combined beam include cutting, welding, burning, exposing, exciting, ablating, melting, drilling, additive manufacturing, and direct metal laser sintering. Irradiance at the different wavelengths can be tailored for the particular application based on the design, configuration, or power supplied to the diode lasers.

Figure 10:
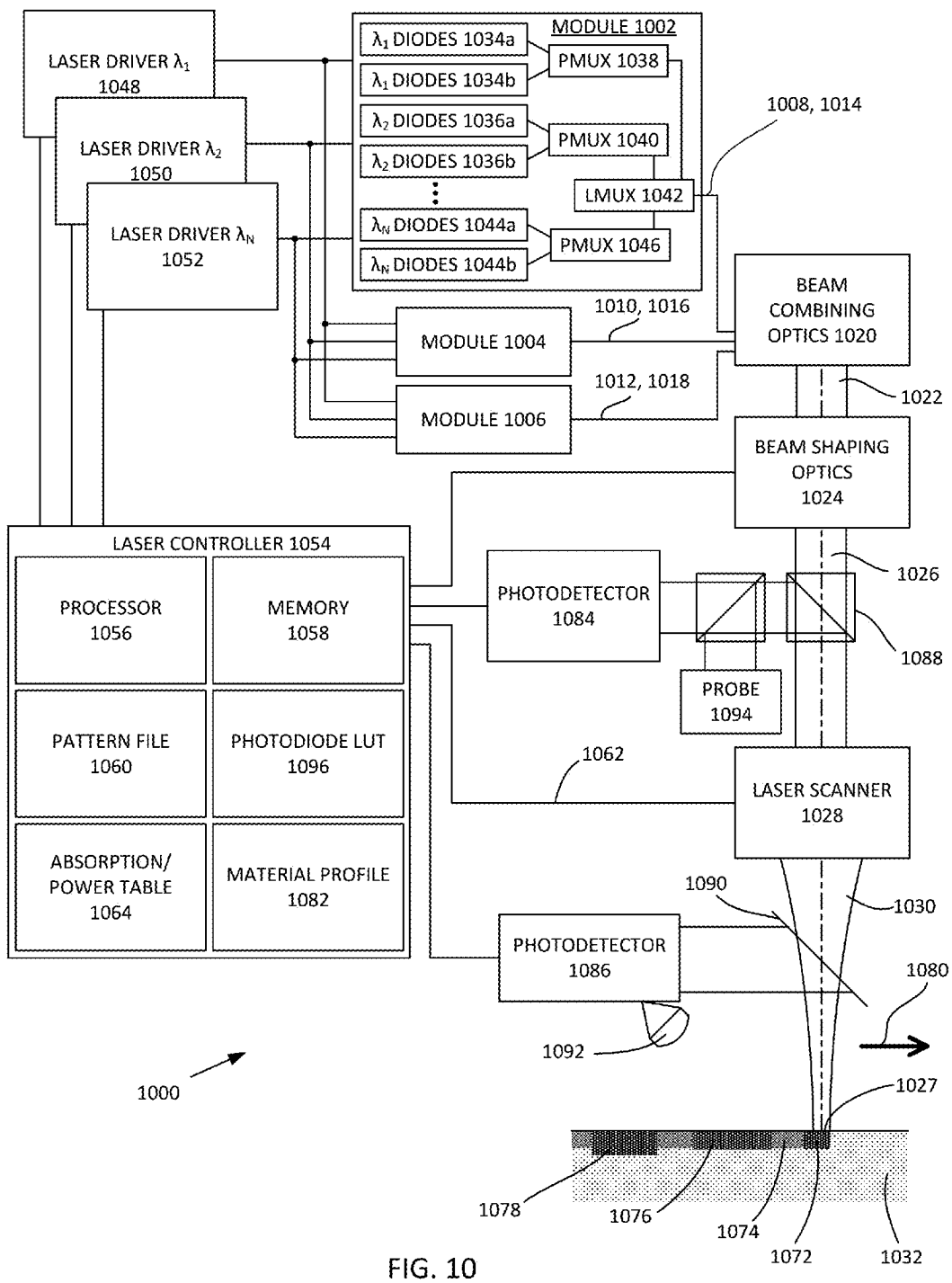
FIG. 10 is a schematic of a multi-wavelength laser system.

In one example shown in FIG. 10, a multi-wavelength laser system 1000 includes one or more multi-wavelength diode laser modules 1002, 1004, 1006 each situated to emit respective combined beams 1008, 1010, 1012 that are optically coupled out of the respective modules and typically into optical fibers 1014, 1016, 1018 capable of propagating high brightness beams. The beams 1008, 1010, 1012 are received and combined with beam combining optics 1020, such as a fused pump combiner or geometrical optical components, such as prisms, that can be situated to translate or shift beam optical axes to reduce a distance between the optical axes. A combined beam 1022 formed with the beam combining optics is optically coupled to beam shaping optics 1024, that can include one or more of a zoom beam expander, beam homogenizer, focusing optics, etc., that can alter the propagation characteristics of the combined beam 1022 to form a shaped beam 1026 with corresponding shaped characteristics at a beam spot 1027. The shaped beam 1026 is received by a laser scanner 1028 that is typically a 2D or 3D galvanometer-type scanner that includes one or more scan mirrors that direct a scanned beam 1030 to the beam spot 1027 at a multi-wavelength laser target 1032.

The module 1002 includes a plurality of diode groups 1034a, 1034b each including a plurality of diode lasers situated to emit corresponding beams at a first wavelength and a plurality of diode groups 1036a, 1036b each including a plurality of diode lasers situated to emit corresponding beams at a second wavelength $\lambda_2$. The beams emitted by the diode groups 1034a, 1034b are combined with a polarization multiplexer 1038 and the beams emitted by the diode groups 1036a, 1036b are combined with a polarization multiplexer 1040, thereby doubling beam brightness. The polarization multiplexed beams are received by a wavelength multiplexer 1042 doubling beam brightness a second time to form the combined beam 1008. Additional pluralities of laser groups 1044a, 1044b can be situated to emit beams at additional wavelengths $\lambda_N$ that can be polarization multiplexed with a polarization multiplexer 1046 and wavelength multiplexed with the wavelength multiplexer 1042 or additional wavelength multiplexers. In some examples, selected wavelength groups are wavelength multiplexed and two sets of wavelength multiplexed beams are polarization multiplexed.

Separate laser drivers 1048, 1050, 1052 can be electrically coupled to the module 1002 so as to separately power the diode groups 1034*a*, 1034*b* from the diode groups 1036*a*, 1036*b* and the diode groups 1044*a*, 1044*b*. The laser drivers 1048, 1050, 1052 can be similarly coupled to the modules 1004, 1006 or additional laser drivers may be used. The laser drivers 1048, 1050, 1052 are coupled to a controller 1054, that includes a computing environment. Suitable controller types can include one or more computer devices, CPLDs, PLCs, PLDs, PALs, ASICs, etc., with each typically including one or more processors 1056 and on or more memories 1058 for controlling the modulation characteristics of the laser drivers 1048, 1050, 1052, such as output voltages, and other components of the multi-wavelength laser system 1000. The memory 1058 can include volatile memory, such as registers, cache, and RAM, non-volatile memory, such as ROM, EEPROM, and flash memory, or a combination. The memory 1058 is accessible by the processor 1056 and can store software in the form computer-executable instructions that can be executed by the processor 1056. The memory 1058 can also include removable or non-removable storage including magnetic media, CD-ROMS, DVDs, or any other medium that can be used to store information in a non-transitory way and which can be accessed within the computing environment.

In typical examples the memory 1058 can store instructions, look-up tables, and data arrays, by way of example, implementing multi-wavelength laser processing techniques. For example, the laser controller 1054 can include a pattern file 1060 that includes a scan instructions so that a laser scan command 1062 can be sent to the laser scanner 1028 to process predetermined locations, paths, durations, etc., of the target 1032. The controller 1054 can also include a material absorption/power table 1064 that includes material-specific absorption values and associated power levels, including wavelength-dependent absorption and power levels. The controller 1054 can vary electrical outputs 1066, 1068, 1070 of the respective laser drivers 1048, 1050, 1052 to vary the relative power of the combined beam 1008 at the different wavelengths $\lambda_1, \lambda_2, \lambda_N$. With the laser drivers 1048, 1050, 1052 similarly coupled to the diode groups of the other modules 1004, 1006, similar variations in wavelength-dependent power can be provided for the combined beams 1010, 1012.

For example, the target 1032 can include material regions 1072, 1074, 1076, 1078 with different wavelength-dependent absorption characteristics or desired laser processing effects. During active movement of the scanned beam 1030 along a scan direction 1080, the controller 1054 can determine a power level to be supplied based on the absorption/power table 1064 and the pattern file 1060 that includes a material type identifier for various positions of the target 1032 in the field of view of the laser scanner 1028. The power level can also adjusted based on a predetermined material profile 1082 of the target 1032 so that different material types or processes with associated absorption and power characteristics can be selected during processing or for different targets. The material profile 1082 can also provide power correction, modulation, or other values that can vary based on the type of target or target layer that is processed. Some materials, for example, can include multiple layers and laser processing can involve targeting of different material layers or different absorption peaks for a particular material. In some examples, one or more photo-detectors 1084, 1086 are optically coupled to the target 1032, e.g., through respective beam splitters 1088, 1090 or directly through a lens 1092. The absorptive or other material characteristics can be determined passively or with active illumination, such as with a probe beam source 1094 and absorption characteristics of the material can be correlated in a photodiode look-up table 1096.

The laser system 1000 can be used in various applications where multiple wavelengths are desired, and particularly where high brightness processing beams are provided at the multiple wavelengths. In some system examples, the emission wavelengths of the laser diodes are selected based on one or more absorption peaks, lines, or bands of a material of the target 1032 or material layer of the target. Some absorption peaks can correspond to bio-medical application, such as fat tissue absorption. Predetermined or detected target fat content or type can determine the spectral content and power level selected for the combined beams 1008, 1010, 1012 with the controller 1054. In addition to providing multiple wavelengths for pumping ytterbium-based fiber lasers (e.g., near 920 nm and 976 nm), other solid state media can also benefit from the high brightness and configurable laser pumping capabilities of the modules 1002, 1004, 1006. For example, neodymium vanadate (Nd:YVO4) crystals typically have absorption peaks at multiple wavelengths, including 808 nm, 885 nm, 878 nm, and 888 nm. In some examples, two or more of the absorption peaks are selected and generated by each module 1002, 1004, 1006.

In some examples, the target 1032 can include a fine metal powder or other selective melting or additive manufacturing target material. Laser diodes in the modules 1002, 1004, 1006 can be selected so that emitted beams correspond to different absorption peaks or response characteristics of the metal powder or portions of the target 1032 that have undergone laser processing, including providing a wavelength associated with a reduced or increased absorption for a selected power level. In some system examples, laser processing techniques can be altered during scanning or between scanning targets. For example, the pattern file 1060 can identify a process type or sub-process type having wavelength-dependent processing characteristics so that the laser system 1000 can alternate between cutting and welding, selective melting and cutting, cutting and drilling, etc., with power level and selected wavelength varying according to the requirements of the particular process or sub-process.

Figure 11:
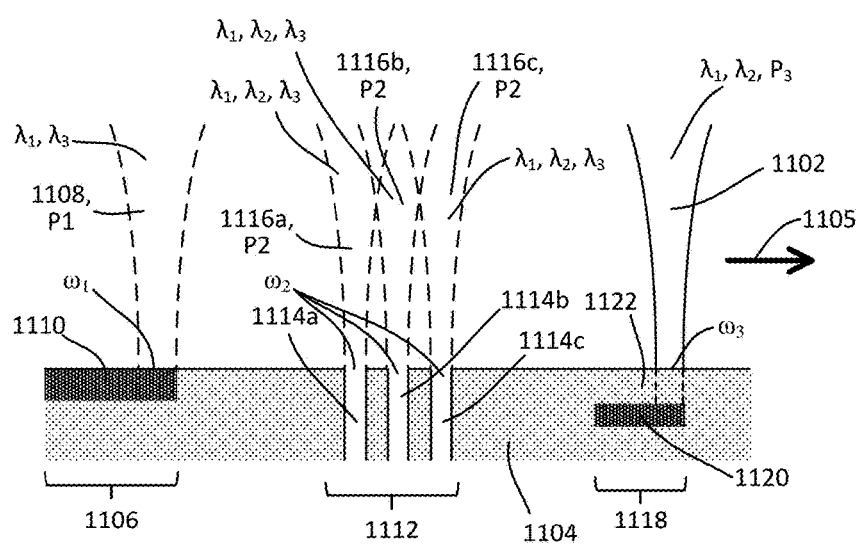
FIG. 11 is a side cross-section depicting a multi-wavelength processing method.

FIG. 11 depicts an example of a multi-wavelength laser processing method 1100. During laser processing, at least one laser beam 1102 is generated by a laser source is scanned in relation to a target 1104, such as by scanning movement of the laser beam 1102 across the target 1104 in a laser scanner field of view in a scan direction 1105, movement of the target 1104, or both. The laser beam 1102 can include a plurality of individual diode laser beams, with groups of the individual diode laser beams having different emission wavelengths, and with the different wavelength beam groups having a selectable power level separate from each other. To provide substantial brightness for the laser beam 1102 directly based on the individual diode lasers, the laser source generating the laser beam 1102 is formed by polarization multiplexing the beams of a wavelength beam group and wavelength multiplexing the polarization multiplexed wavelength beam groups. In additional examples, groups of beams of different wavelengths are first wavelength multiplexed and a pair of wavelength multiplexed beam groups are then polarization multiplexed. The polarization and wavelength multiplexed beams are optically coupled into an optical fiber or via free-space (e.g., with collimation optics or other relay optics) to provide the laser beam 1102 so that it can be directed to the target 1104.

During laser processing, such as during a scan movement or between scan movements, characteristics of the laser beam 1102 can be adjusted based on detected or predetermined target characteristics or to produce different laser processing effects. For example, a laser beam 1108 is generated by the laser source and directed to a first region 1106 of the target 1104 with predetermined beam characteristics, such as a selected spot size $\omega_1$, laser power level $P_1$, and wavelength content $\lambda_1$, $\lambda_3$ to melt or anneal a target portion 1110 with predetermined optical absorption characteristics. At an adjacent region 1112, a plurality of regions 1114a, 1114b, 1114c are drilled or cut with respective laser beams 1116a, 1116b, 1116c generated with the same laser source operating at a power level $P_2$, spot size $\omega_2$, and wavelength content $\lambda_1$, $\lambda_2$, $\lambda_3$. In an adjacent region 1118, the laser beam 1102 at a selected spot size $\omega_3$ and power $P_3$ provides a subsurface material change in a subsurface portion 1120 based on the selected wavelengths $\lambda_1$, $\lambda_2$ selected in relation to a transparency of a surface region 1122.

In view of the many possible embodiments to which the principles of the disclosed technology may be applied, it should be recognized that the illustrated embodiments are only representative examples and should not be taken as limiting the scope of the disclosure. Alternatives specifically addressed in these sections are merely exemplary and do not constitute all possible alternatives to the embodiments described herein. For instance, various components of systems described herein may be combined in function and use. We therefore claim all that comes within the scope and spirit of the appended claims.

We claim:

1. A method, comprising:
    generating in a modular thermally conductive laser diode package a first plurality of free-space propagating pump beams from respective diode lasers at a first wavelength range between of 900 nm to 930 nm;
    generating in the modular thermally conductive laser diode package a second plurality of free-space propagating pump beams from respective diode lasers at a second wavelength range between 970 nm to 980 nm;
    polarization multiplexing the first plurality of pump beams with a first polarization multiplexer situated to produce a first set of polarization multiplexed pump beams by receiving a first subset of the first plurality of pump beams having a first polarization state at a half-wave plate and rotating the first polarization state to a second polarization state orthogonal to the first polarization state, and by combining a second subset of the first plurality of pump beams having the first polarization state and the first subset of the first plurality of pump beams having the second polarization state at a polarizing beam splitter;
    polarization multiplexing the second plurality of pump beams with a second multiplexer situated to produce a second set of polarization multiplexed pump beams by receiving a first subset of the second plurality of pump beams having a first polarization state at a half-wave plate and rotating the first polarization state to a second polarization state orthogonal to the first polarization state, and by combining a second subset of the second plurality of pump beams having the first polarization state and the first subset of the second plurality of pump beams having the second polarization state at a polarizing beam splitter;
    combining in the modular thermally conductive laser diode package the first set of polarization multiplexed pump beams with the second set of polarization multiplexed pump beams in the modular thermally conductive laser diode package to form a free-space propagating combined pump beam having an optical power of at least 100 W and a brightness of 2 W/(mm-mrad)$^2$ or greater; and
    directing the combined pump beam through free-space into a pump fiber input endface coupled to an optical output of the modular thermally conductive laser diode package.

2. The method of claim 1, further comprising:
    coupling the at least one combined pump beam from the pump fiber to a gain fiber so as to produce optical gain in the gain fiber.

3. The method of claim 2, further comprising generating an output beam at an output beam wavelength from the gain fiber.

4. The method of claim 3, wherein the gain fiber includes a fiber master oscillator situated to generate a signal beam and a fiber amplifier situated to receive the signal beam and to amplify the signal beam to produce the output beam.

5. The method of claim 4, wherein an SRS threshold associated with the gain fiber is at least 4 kW.

6. The method of claim 2, wherein the gain fiber includes a ytterbium-doped core wherein the output beam wavelength corresponds to a ytterbium-based emission, and the first wavelength range corresponds to a ytterbium absorption peak or band associated, and the second wavelength range corresponds to a separate ytterbium absorption peak or band.

7. The method of claim 1, further comprising narrowing the linewidth of the plurality of pump beams from the respective diode lasers in the second wavelength range with a single diffraction grating coupled to the plurality of pump beams or a diffraction grating coupled to each respective pump beam of the plurality of pump beams.

8. The method of claim 7, further comprising narrowing the linewidth of the plurality of pump beams from the respective diode lasers in the first wavelength range.

9. The method of claim 1, wherein a plurality of the pump beams the second wavelength range is generated at respective wavelength centers, including wavelength centers for a predetermined diode laser temperature that are outside of a ytterbium absorption peak in the range of 970 nm and 980 nm, that reduce a variation in absorbed power associated with the ytterbium absorption peak and a temperature-dependent and/or current-dependent drift of the wavelength centers.

10. The method of claim 1, wherein the combined pump beam has a brightness of at least 3.0 W/(mm-mrad)$^2$.

11. The method of claim 10, wherein the pump fiber has a core with a diameter of selected between 100 µm and 110 µm and an NA selected between 0.14 and 0.16.

12. The method of claim 10, wherein the brightness is at least 4.0 W/(mm-mrad)$^2$.

13. The method of claim 1, further comprising:
    generating a plurality of pump beams from respective diode lasers at 'n' wavelengths;
    wherein 'n' includes the first and second wavelength ranges and each of the 'n' wavelengths is associated with one or more absorption bands of a ytterbium laser.

14. The method of claim 1, further comprising:
    coupling the combined pump beam to a laser gain medium that includes a Nd, Yb, Ho, Er, or Tm doped optical material to produce optical gain in the laser gain medium, wherein the first and second wavelength ranges correspond to absorption peaks or bands of the doped optical material.

15. The method of claim 14, wherein the laser gain medium includes a semiconductor, gas, or liquid material.

16. The method of claim 1, wherein the plurality of diode lasers generating the first plurality of pump beams and the first polarization multiplexer are arranged on a first common housing portion and the plurality of diode lasers generating second plurality of pump beams and the second polarization multiplexer are arranged on a second common housing portion that is adjacent to the first common housing portion and that forms a modular extension of the modular laser diode pump package.

17. A method, comprising:
generating a first plurality of optical beams from respective diode lasers in a modular thermally conductive laser diode package at a first wavelength and polarization multiplexing the first plurality of optical beams with a first polarization multiplexer situated to produce a first set of polarization multiplexed optical beams by receiving a first subset of the first plurality of optical beams having a first polarization state at a half-wave plate and rotating the first polarization state to a second polarization state orthogonal to the first polarization state, and by combining a second subset of the first plurality of optical beams having the first polarization state and the first subset of the first plurality of optical beams having the second polarization state at a polarizing beam splitter;
generating a second plurality of optical beams from respective diode lasers in the modular thermally conductive laser diode package at a second wavelength different from the first wavelength and polarization multiplexing the second plurality of optical beams with a second multiplexer situated to produce a second set of polarization multiplexed optical beams by receiving a first subset of the second plurality of optical beams having a first polarization state at a half-wave plate and rotating the first polarization state to a second polarization state orthogonal to the first polarization state, and by combining a second subset of the second plurality of optical beams having the first polarization state and the first subset of the second plurality of optical beams having the second polarization state at a polarizing beam splitter;
combining at the first set of polarization multiplexed optical beams with the second set of polarization multiplexed optical beams in the modular thermally conductive laser diode package to form a combined optical beam having an optical power of at least 100 W and a brightness of 2 W/(mm-mrad)$^2$ or greater; and
directing the combined optical beam to a target;
wherein the first and second wavelengths correspond to respective absorption lines, peaks, or bands in the same or different materials or material layers or portions of the target;
wherein the plurality of diode lasers generating the first plurality of pump beams and the first polarization multiplexer are arranged on a first common housing portion and the plurality of diode lasers generating second plurality of pump beams and the second polarization multiplexer are arranged on a second common housing portion that is adjacent to the first common housing portion and that forms a modular extension of the modular laser diode pump package.

18. The method of claim 17, wherein the directing the combined optical beam to the target includes one or more of cutting, welding, burning, exposing, exciting, ablating, melting, drilling, or additive manufacturing the target.

19. The method of claim 17, wherein the target includes one or more of an alloy, plastic, inhomogeneous material, and stack of materials.

20. The method of claim 17, further comprising narrowing the linewidth of at the optical beams of the first plurality of optical beams with a single diffraction grating coupled to one or both of the first and second sets of polarization multiplexed optical beams or a diffraction grating coupled to each respective selected pump beam of the plurality of optical beams before polarization multiplexing.

21. A modular laser diode pump package, comprising:
a heat conductive housing;
a first plurality of diode lasers situated in the heat conductive housing to emit corresponding laser beams having a first wavelength range between 900 nm and 930 nm;
a second plurality of diode lasers situated in the heat conductive housing to emit corresponding laser beams having a second wavelength range between 970 nm and 980 nm;
a first polarization multiplexer situated to produce a first set of polarization multiplexed laser beams by receiving a first subset of the first plurality of laser beams having a first polarization state at a half-wave plate and rotating the first polarization state to a second polarization state orthogonal to the first polarization state, and by combining a second subset of the first plurality of laser beams having the first polarization state and the first subset of the first plurality of laser beams having the second polarization state at a polarizing beam splitter;
a second polarization multiplexer situated to produce a second set of polarization multiplexed laser beams by receiving a first subset of the second plurality of laser beams having a first polarization state at a half-wave plate and rotating the first polarization state to a second polarization state orthogonal to the first polarization state, and by combining a second subset of the second plurality of laser beams having the first polarization state and the first subset of the second plurality of laser beams having the second polarization state at a polarizing beam splitter;
a wavelength multiplexer situated in the heat conductive housing to receive the first and second sets of polarization multiplexed laser beams and to combine the laser beams based on the difference between first and second wavelength ranges into a combined beam having an optical power of at least 100 W and a brightness of 2 W/(mm-mrad)$^2$ or greater;
focusing optics situated to receive and focus the combined beam through free-space; and
an output fiber situated to receive the focused combined beam and to direct the combined beam along the output fiber to a fused pump combiner that receives the combined beams and combines the combined beam with one or more other combined beams received from a plurality of other modular laser diode pump packages.

22. The laser diode package of claim 21, wherein the wavelength multiplexer includes a dichroic beam combiner having a reflectivity so as to reflect the first set of polarization multiplexed laser beams and a transmissivity so as to transmit the second set of polarization multiplexed laser beams;

wherein the transmissivity is buffered from the second wavelength range based on a transmissivity difference between the linear polarization state of the first portion of the second plurality of laser beams and the linear polarization state of the second portion of the second plurality of laser beams.

23. The modular laser diode pump package of claim 21, wherein the first plurality of diode lasers and first polarization multiplexer are arranged on a first common housing portion and the second plurality of diode lasers and second polarization multiplexer are arranged on a second common housing portion that is adjacent to the first common housing portion and that forms a modular extension of the modular laser diode pump package.

24. The modular laser diode pump package of claim 21, further comprising at least one diffraction grating situated to receive at the second plurality of laser beams through free-space and to narrow the linewidth of the respective laser beam.

25. A laser system, comprising:
a pump module situated to couple pump light in free-space as a combined beam in a first wavelength range between 900 nm and 930 nm and a second wavelength range between 970 nm and 980 nm into a pump fiber with the combined beam having an optical power of at least 100 W and a brightness of 2 W/(mm-mrad)$^2$ or greater; and
a gain fiber having a core actively doped to have an absorption spectrum corresponding to the first and second wavelength ranges, the gain fiber situated to receive the combined beam through an optical fiber coupled between the pump module and the gain fiber and to produce an output beam at an output wavelength;
wherein the pump module includes:
a first plurality of diode lasers situated to generate a corresponding first plurality of diode laser pump beams with wavelengths in the first wavelength range and a second plurality of diode lasers situated to generate a corresponding second plurality of diode laser pump beams with wavelengths in the second wavelength range;
a first polarization multiplexer situated to produce a first set of polarization multiplexed diode laser pump beams by receiving a first subset of the first plurality of diode laser pump beams having a first polarization state at a half-wave plate and rotating the first polarization state to a second polarization state orthogonal to the first polarization state, and by combining a second subset of the first plurality of diode laser pump beams having the first polarization state and the first subset of the first plurality of diode laser pump beams having the second polarization state at a polarizing beam splitter;
a second polarization multiplexer situated to produce a second set of polarization multiplexed diode laser pump beams by receiving a first subset of the second plurality of diode laser pump beams having a first polarization state at a half-wave plate and rotating the first polarization state to a second polarization state orthogonal to the first polarization state, and by combining a second subset of the second plurality of diode laser pump beams having the first polarization state and the first subset of the second plurality of diode laser pump beams having the second polarization state at a polarizing beam splitter; and
a dichroic wavelength multiplexer situated to receive and multiplex the first set of polarization multiplexed diode laser pump beams and the second set of polarization multiplexed diode laser pump beams to form the combined beam.

26. The laser system of claim 25, wherein the gain fiber includes a master oscillator situated to generate a signal beam and a fiber amplifier situated to receive and amplify the signal beam so as to generate the output beam.

27. The laser system of claim 25, wherein the combined beam coupled into the pump fiber has a brightness of at least 3.0 W/(mm-mrad)$^2$.

28. The laser system of claim 25, wherein the first plurality of diode lasers and first polarization multiplexer are arranged on a first common housing portion and the second plurality of diode lasers and second polarization multiplexer are arranged on a second common housing portion that is adjacent to the first common housing portion and that forms a modular extension of the modular laser diode pump package.

29. The laser system of claim 25, wherein the pump module includes at least one diffraction grating situated to receive at the second plurality of laser beams through free-space and to narrow the linewidth of the respective laser beam.

* * * * *

UNITED STATES PATENT AND TRADEMARK OFFICE
CERTIFICATE OF CORRECTION

PATENT NO. : 10,153,608 B2  
APPLICATION NO. : 15/462596  
DATED : December 11, 2018  
INVENTOR(S) : Hemenway et al.

Page 1 of 1

It is certified that error appears in the above-identified patent and that said Letters Patent is hereby corrected as shown below:

In the Claims

Column 19, Line 60, Claim 17, "plurality of pump beams" should read --plurality of optical beams--

Column 19, Line 63, Claim 17, "second plurality of pump beams" should read --the second plurality of optical beams--

Column 19, Line 67, Claim 17, "modular laser diode pump package." should read --modular thermally conductive laser diode package.--

Column 20, Line 9, Claim 20, "linewidth of at the optical" should read --linewidth of at least one of the optical--

Column 20, Line 13, Claim 20, "selected pump beam" should read --selected optical beam--

Signed and Sealed this  
Seventeenth Day of March, 2020

Andrei Iancu  
*Director of the United States Patent and Trademark Office*